United States Patent [19]
Hashimoto et al.

[11] Patent Number: 5,251,070
[45] Date of Patent: Oct. 5, 1993

[54] CATADIOPTRIC REDUCTION PROJECTION OPTICAL SYSTEM

[75] Inventors: Sumio Hashimoto, Tokyo; Yutaka Ichihara; Hideo Mizutani, both of Yokohama, all of Japan

[73] Assignee: Nikon Corporation, Tokyo, Japan

[21] Appl. No.: 948,428

[22] Filed: Sep. 22, 1992

[30] Foreign Application Priority Data

Sep. 28, 1991 [JP] Japan ................. 3-276593
Sep. 28, 1991 [JP] Japan ................. 3-276595

[51] Int. Cl.$^5$ ............................. G02B 17/00
[52] U.S. Cl. ........................ 359/732; 359/727
[58] Field of Search ................ 359/726-727, 359/732, 733-736, 487, 495

[56] References Cited

U.S. PATENT DOCUMENTS

| | | | |
|---|---|---|---|
| 3,698,808 | 10/1972 | Delmas | 355/45 |
| 4,747,678 | 5/1988 | Shafer et al. | 359/366 |
| 4,953,960 | 9/1990 | Williamson | 359/726 |
| 5,089,913 | 2/1992 | Singh et al. | 359/727 |

FOREIGN PATENT DOCUMENTS

| | | |
|---|---|---|
| 51-27116 | 8/1976 | Japan . |
| 63-163319 | 7/1988 | Japan . |
| 2-66510 | 3/1990 | Japan . |
| 1321303 | 6/1973 | United Kingdom ............... 359/487 |

Primary Examiner—Martin Lerner
Assistant Examiner—James Phan
Attorney, Agent, or Firm—Shapiro and Shapiro

[57] ABSTRACT

This invention intends to provide a catadioptric reduction projection optical system of a construction in which an on-axis light beam is used in a catadioptric system and resolving power is prevented from being deteriorated, and more particularly a catadioptric reduction projection optical system having a first lens unit G1 of negative refractive power for diffusing a light beam from a reticle 1, a semi-transparent mirror 5 for transmitting therethrough the light beam from the first lens unit G1, plane parallel plates 2, 3 and 4 disposed obliquely with respect to the optical axis between the first lens unit G1 and the semi-transparent mirror 5 for correcting aberrations attributable to the semi-transparent mirror 5, a concave reflecting mirror 7 for returning the light beam emerging from the semi-transparent mirror 5 to the semi-transparent mirror 5 while converging the light beam, and a second lens unit G3 of positive refractive power for converging the light beam returned to the semi-transparent mirror 5 and reflected by the semi-transparent mirror 5 and forming the reduced image of the pattern on the reticle 1 on a wafer 8.

12 Claims, 7 Drawing Sheets

CATADIOPTRIC REDUCTION PROJECTION OPTICAL SYSTEM

BACKGROUND OF THE INVENTION

1. Field of the Invention

This invention relates to a catadioptric reduction projection optical system suitable for application as an optical system for reduction-projecting a pattern more enlarged than the pattern of a real element which is used, for example, in an exposure apparatus for the manufacture of semiconductive elements.

2. Related Background Art

Semiconductive integrated circuits have become more and more minute and higher resolving power is required of exposure apparatuses for printing the patterns thereof. To satisfy this requirement, the wavelength of a light source must be shortened and the numerical aperture (N.A.) of an optical system must be made great. However, if the wavelength becomes short, glass materials which stand practical use for the absorption of light become limited. If the wavelength becomes 300 nm or less, practically usable glass materials will be only synthetic quartz and fluorite (calcium fluoride). Fluorite is bad in temperature characteristic and cannot be used in a great quantity. Therefore it is very difficult to make a projection lens of a refracting system alone. Further, due to the difficulty of aberration correction, it is also difficult to make a projection optical system of great numerical aperture of a reflecting system alone.

So, various techniques of combining a reflecting system and a refracting system to thereby construct a projection optical system have heretofore been proposed. An example of them is a ring field optical system as disclosed in U.S. Pat. No. 4,747,678 (corresponding to Japanese Laid-Open Patent Application No. 63-163319). In this optical system, an off-axis light beam is used so that incident light and reflected light may not interfere with each other, and design is made such that only the off-axis zonal portion is exposed.

As another example, a projection exposure apparatus comprising a catadioptric system in which a beam splitter is disposed in a projection optical system, whereby the image of a reticle (mask) is collectively projected by an on-axis light beam is disclosed, for example, in U.S. Pat. No. 3,698,808 (corresponding to Japanese Patent Publication No. 51-27116) and U.S. Pat. No. 4,953,960 (corresponding to Japanese Laid-Open Patent Application No. 2-66510).

Figure 7:
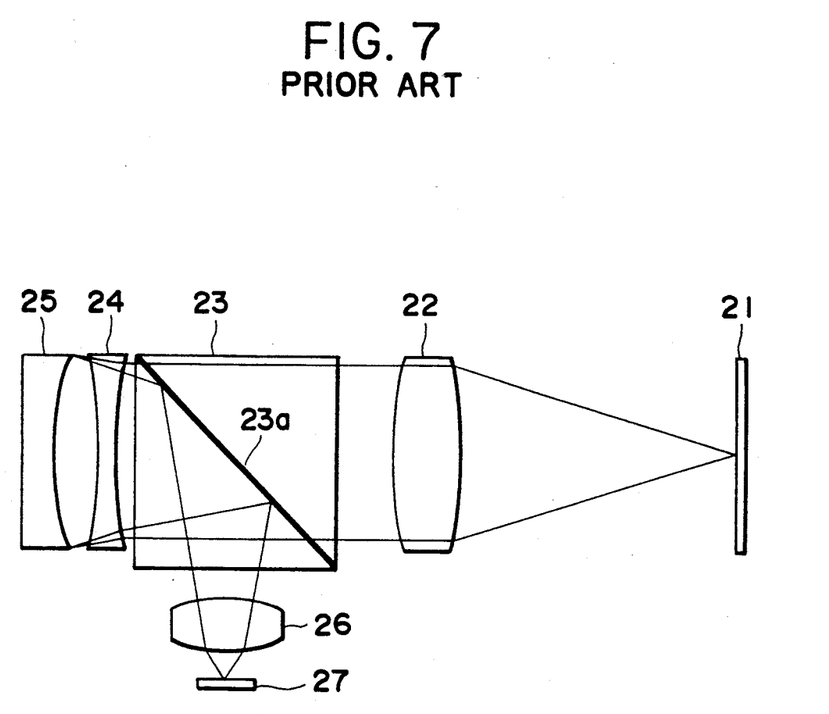
FIG. 7 is a cross-sectional view showing the basic construction of a catadioptric reduction. projection optical system according to the prior art.

FIG. 7 of the accompanying drawings schematically shows the optical system disclosed in U.S. Pat. No. 4,953,960. In FIG. 7, a light beam from a reticle 21 on which a pattern to be reduction-transferred is depicted is converted into a substantially parallel light beam by a lens unit 22 having positive refractive power and is applied to a prism type beam splitter (beam splitter cube) 23. The light beam transmitted through the joint surface 23a of the beam splitter 23 is diffused by a correcting lens unit 24 having negative refractive power and is reflected by a concave reflecting mirror 25. The light beam reflected by the concave reflecting mirror 25 passes again through the correcting lens unit 24 and is reflected by the joint surface 23a of the beam splitter 23, whereafter it is converged on a wafer 27 by a lens unit 26 having positive refractive power, and the reduced image of the reticle pattern is formed on the wafer 27. An example in which a semi-transparent mirror comprising a plane parallel plate is used instead of the prism type beam splitter is also disclosed in the aforementioned patent.

In the ring field optical system of the prior art, however, it is difficult to make the numerical aperture great. Moreover, exposure cannot be collectively effected and therefore, it is necessary to effect exposure while moving the reticle and the wafer at different speeds correspondingly to the reduction ratio of the optical system, and this has led to the inconvenience that the construction of a mechanical system becomes complicated.

Also, the construction disclosed in the aforementioned U.S. Pat. No. 3,698,808 suffers from the inconvenience that the flare by the reflection on the refracting surface of the optical system subsequent to the beam splitter is great. Further, no consideration is given to characteristics such as the reflectance irregularity, absorption and phase variation of the beam splitter and therefore, the resolving power is low and also, the magnification of the entire system is one-to-one magnification, and the apparatus of this patent cannot possibly stand the use as the exposure apparatus for the manufacture of semiconductors of the coming generation of which higher resolving power will be required.

Further, of the projection optical systems disclosed in U.S. Pat. No. 4,953,960, the optical system of FIG. 7 suffers from the inconvenience that the resolving power is deteriorated by the non-uniformity of the material of the bulky prism for the beam splitter 23. It also suffers from the inconvenience that there is no adhesive agent usable for the wavelength range of about 300 nm or less and it is difficult to construct a beam splitter by cementing two blocks together. Also, in an example wherein an obliquely disposed plane parallel plate having a half-transmitting surface is used in lieu of the beam splitter 23 of the optical system of FIG. 7, there has been the inconvenience that the resolving power is deteriorated as a whole by aberrations attributable to the obliquely disposed plane parallel plate.

SUMMARY OF THE INVENTION

In view of the above-noted points, the present invention has as an object the provision of a reduction projection optical system of a construction in which an on-axis light beam is used in a catadioptric system and resolving power is not deteriorated.

Figure 1:
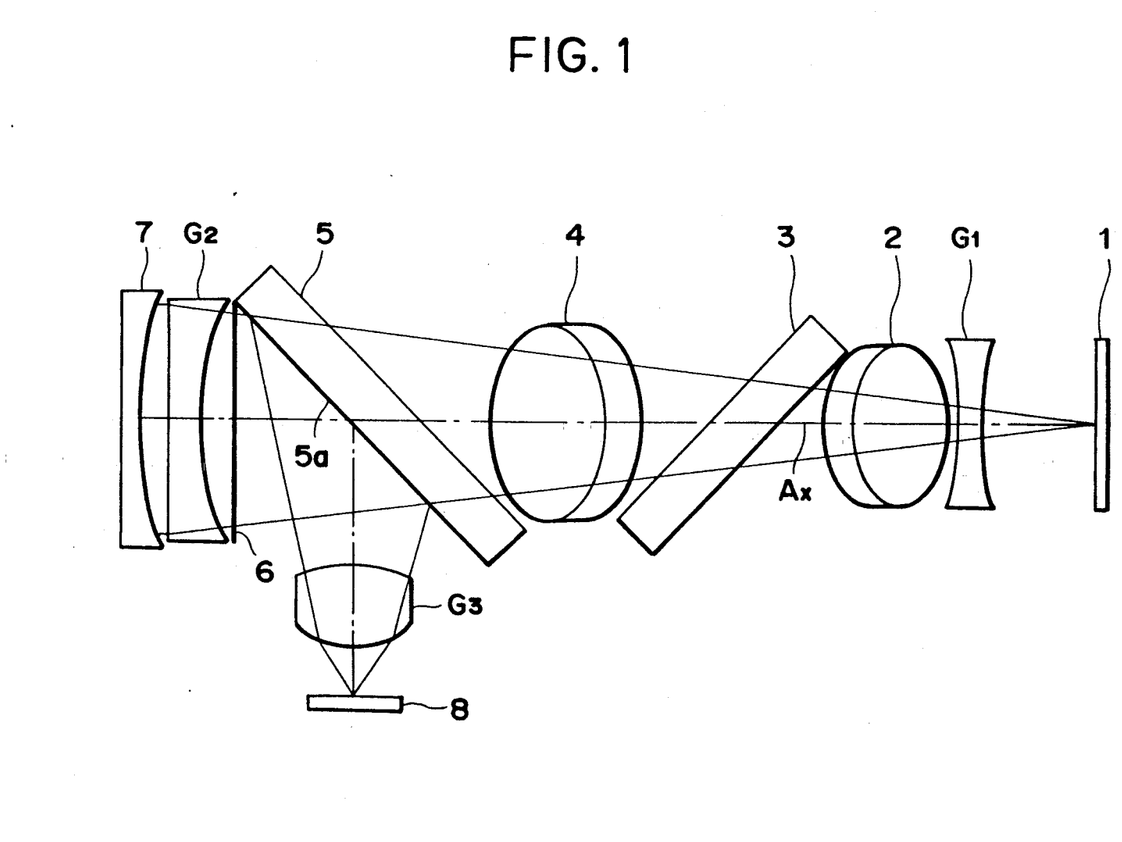
FIG. 1 is a cross-sectional view showing a basic construction of a catadioptric reduction projection optical system according to the present invention.

As shown in FIG. 1 of the accompanying drawings, a catadioptric optical system according to the present invention for reduction-projecting the pattern of a first surface onto a second surface uses a semi-transparent mirror 5 comprising a plane parallel plate disposed obliquely with respect to the optical axis of the optical system, as a beam splitter for dividing a light beam from the first surface 1 into a reflecting optical path and a transmitting optical path. Correcting means for correcting aberrations, specifically astigmatism and coma, created when the light beam is transmitted through the semi-transparent mirror 5 comprising the plane parallel plate is provided between a first object surface and the semi-transparent mirror. Specifically, the catadioptric optical system has a first lens unit G1 of negative refractive power for causing the light beam from said first surface 1 to diverge or converge, the semi-transparent mirror 5 having a plane parallel plate for transmitting therethrough or reflecting the light beam from said first lens unit G1, a concave reflecting mirror 7 for returning the light beam emerging from the semi-transparent mirror 5 to said semi-transparent mirror while condensing said light beam, a second lens unit G2 of negative refractive power disposed between said semi-transparent mirror and said concave reflecting mirror, and a third lens unit G3 of positive refractive power for converging the light beam returned to said semi-transparent mirror 5 by the reflection on said concave reflecting mirror and reflected by or transmitted through said semi-transparent mirror, and forming the reduced image of the pattern of said first surface on said second surface 8.

The correcting means for correcting aberrations created by the semi-transparent mirror is disposed between the first lens unit G1 and said semi-transparent mirror, and said aberration correcting means has at least one correcting plane parallel plate 2, 3, 4 disposed obliquely with respect to the optical axis of the first lens unit G1, and said correcting plane parallel plate and the plane parallel plate of said semi-transparent mirror are disposed at locations whereat azimuth angles defined as the directions of normals to the respective plane parallel plates have been rotated by an angle of multiples of 90° about the optical axis of the first lens unit G1.

In case that said first lens unit G1 has a negative refractive power, it is preferable to provide three plane parallel plates disposed obliquely with respect to the optical axis of said first lens unit G1 as correcting means for correcting aberrations. These correcting plane parallel plates and the plane parallel plate of said semi-transparent mirror are disposed at locations whereat azimuth angles defined as the directions of normals to the respective plane parallel plates have been rotated by an angle of 90° each about the optical axis of the first lens unit G1.

According to such present invention, in a construction wherein a reflecting system and a refracting system are combined together, an on-axis light beam is used to expose a wide area collectively. Also, the reflecting system has no chromatic aberration and therefore, the concave reflecting mirror can be endowed with most of the refractive power of the entire system to suppress the creation of chromatic aberration. The separation of incident light and reflected light is effected by the semi-transparent mirror. The use of the semi-transparent mirror is because a large glass material as compared with a prism type beam splitter is unnecessary, because the semi-transparent mirror is a single piece and does not require any adhesive agent and because the surface accuracy may be had correspondingly to the refractive index.

However, the use of the semi-transparent mirror 5 creates astigmatism and coma. To prevent this, three plane parallel plates 2, 3 and 4 are disposed obliquely with respect to the optical axis between the semi-transparent mirror 5 and the first lens unit G1. In this case, the thicknesses of the plane parallel plates 2, 3 and 4 are made equal to the thickness of the semi-transparent mirror 5, and these plane parallel plates are inclined by 45° with respect to the optical axis. Further, as shown in FIG. 1, the azimuths of the plane parallel plates 4, 3 and 2 are rotated by 90°, 180° and 270°, respectively, from the azimuth of the semi-transparent mirror 5, whereby the astigmatism and coma created by the semi-transparent mirror 5 are completely corrected.

Figure 2:
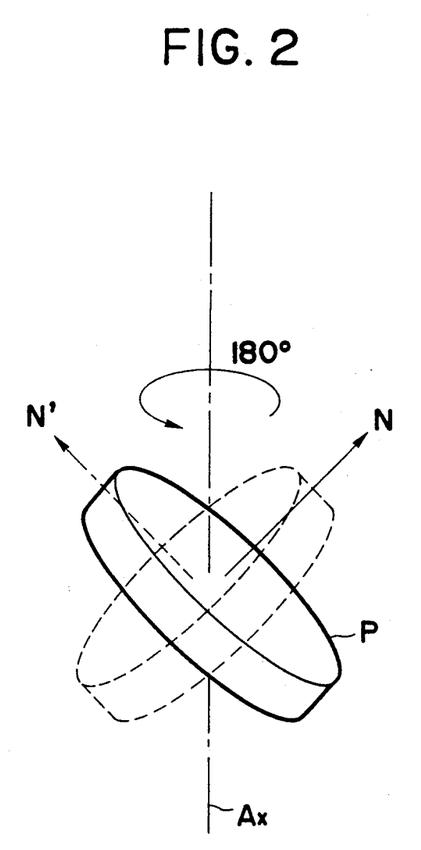
FIG. 2 is a perspective view showing the azimuth angle of an obliquely disposed plane parallel plate.

Here, the azimuth angle of the plane parallel plate, as shown in FIG. 2 of the accompanying drawings, refers to the azimuth angle of the normal N on the optical axis of the obliquely disposed plane parallel plate P about the optical axis, and by the plane parallel plate P being rotated by a predetermined angle about the optical axis Ax, the azimuth angle is changed by that angle. For example, if the obliquely disposed plane parallel plate P indicated by solid lines in FIG. 2 is rotated by 180° about the optical axis Ax, it will assume a position indicated by broken lines, and in this position, the solid line normal N and the broken line normal N' are rotated by 180° about the optical axis, and the azimuth angles of the plane parallel plate P form 180° with respect to each other.

In the construction of FIG. 1, the second lens unit G2 of negative refractive power between the semi-transparent mirror 5 and the concave reflecting mirror 7 is for correcting the chromatic aberration of the third lens unit G3 of positive refractive power better and correcting the spherical aberration of the concave reflecting mirror 7 better. However, the second lens unit G2 of negative refractive power can be eliminated in the relation thereof with the other lens units.

Figure 3:
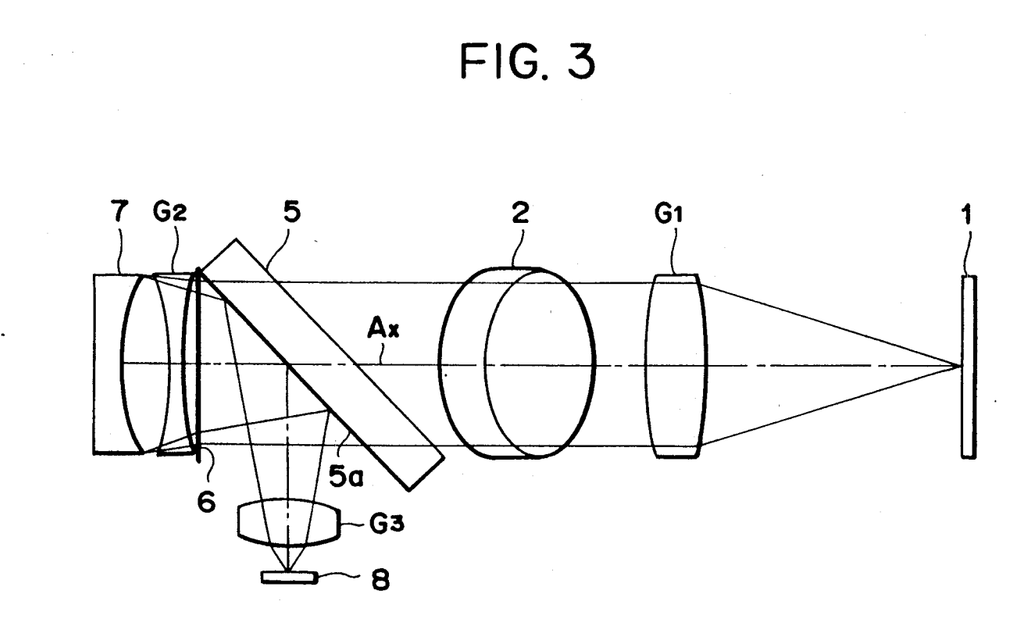
FIG. 3 is a cross-sectional view showing another basic construction of the catadioptric reduction projection optical system according to the present invention.

On the other hand, where the first lens unit G1 has positive refractive power, as shown in FIG. 3 of the accompanying drawings, the light beam from the first surface passing through the first lens unit G1 can be converted into a substantially parallel light beam and therefore, aberrations created when the light beam is transmitted through the semi-transparent mirror comprising the plane parallel plate can be made relatively small. Therefore, by providing only one correcting plane parallel plate as aberration correcting means, it becomes possible to maintain a good performance. Again in this case, the correcting plane parallel plate and the plane parallel plate of said semi-transparent mirror are disposed at locations whereat azimuth angles defined as the directions of normals to the respective plane parallel plates have been rotated by an angle of 90° about the optical axis of the first lens unit G1.

Specifically, the plane parallel plate 2 equal in thickness to the semi-transparent mirror 5 is disposed at an angle of 45° with respect to the optical axis and the azimuth of the plane parallel plate 2 is rotated by an angle of 90° with respect to the azimuth of the plane parallel plate 5 as the semi-transparent mirror, whereby astigmatism is corrected well.

That is, by the azimuths of the inclinations of the semi-transparent mirror 5 and the plane parallel plate 2 deviating by 90° from each other, astigmatism is corrected. Coma increases conversely, but astigmatism is greater in influence, and by the light transmitted through the semi-transparent mirror 5 being made sufficiently parallel, the influence of coma can be almost neglected.

Description will now be made of the reason why it is preferable that the radius of curvature of the concave reflecting mirror 7 be 17 times to 25 times as great as the diameter of the exposure area (image circle) on the second surface 8. In the concave reflecting mirror, a certain degree of reduction magnification can be achieved by the converging action thereof and also, Petzval sum, astigmatism and distortion are affected thereby and therefore, it becomes possible to maintain the aberration balance with the refracting system comprising the first lens unit G1 and the second lens unit G2 good. That is, if the radius of curvature of the concave reflecting mirror 7 is below 17 times the diameter of the image circle of the second surface 8, it will be advantageous for the correction of chromatic aberration, but Petzval sum will increase in the positive direction and astigmatism and distortion will also increase.

The reason is that if the radius of curvature of the concave reflecting mirror becomes small and refractive power becomes great, the spherical aberration by the concave reflecting mirror 7 will become great, but for the correction of the spherical aberration, it becomes necessary to make the positive refractive power of the second lens unit G2 great. However, the second lens unit G2 is disposed at a location near the second surface 8 as the image plane and therefore, for the correction of aberrations, great refractive power becomes necessary and thus, Petzval sum increases remarkably. Accordingly, to correct aberrations better, it is desirable that the radius of curvature of the concave reflecting mirror 7 be about 19 or more times as great as the diameter of the image circle of the reduced image.

If conversely, the radius of curvature of the concave reflecting mirror 7 becomes great beyond 25 times the diameter of the image circle of the reduced image, it will be advantageous for the correction of astigmatism and distortion, but it will become difficult to obtain a desired reduction magnification and the correction of chromatic aberration will become insufficient, and this is not very practical.

Description will now be made of the reason why it is preferable that the inclination of the off-axis principal ray incident on the concave reflecting mirror 7 with respect to the optical axis be 6° or less. If the inclination of the off-axis principal ray is not so limited, the astigmatism, etc. of the concave reflecting mirror will become too great.

Also, the inclination of the off-axis principal ray incident on the semi-transparent mirror 5 is limited and therefore, the transmittance and reflectance on the semi-transparent mirror 5 are stabilized. So, by limiting the inclination of the off-axis principal ray with respect to the optical axis, the imaging performance is improved as a whole.

Description will also be made of the operational effect in a case where a quarter wavelength plate 6 is disposed between the semi-transparent mirror 5 and the concave reflecting mirror 7. Generally, for example, dielectric material film used as the semi-transparent surface of a semi-transparent mirror has a strong polarizing characteristic, and for example, a light beam polarized in parallelism to the plane of the drawing sheet of FIG. 1 (p-polarized light) is readily transmitted through the semi-transparent surface 5a of the semi-transparent mirror 5 and a light beam polarized perpendicularly to the plane of the drawing sheet of FIG. 1 (s-polarized light) is readily reflected by the semi-transparent surface 5a of the semi-transparent mirror 5. In this case, the p-polarized light component transmitted through the semi-transparent surface 5a is transmitted through the quarter wavelength plate 6 and becomes circularly polarized light, and this circularly polarized light beam is reflected by the concave reflecting mirror 7 and becomes circularly polarized light opposite in direction. The reflected circularly polarized light opposite in direction is transmitted through the quarter wavelength plate 6, whereby it becomes s-polarized light, and most of this s-polarized light beam is reflected by the semi-transparent surface 5a of the semi-transparent mirror 5 and travels toward the second surface 8. Accordingly, not only the loss of the quantity of light in the semi-transparent mirror 5 can be decreased by the quarter wavelength plate 6, but also it becomes difficult for any excess reflected light to return to the second surface 8 and thus, flare can be decreased.

Further, it is desirable that thin uniaxial crystal (e.g. rock crystal) be used as the quarter wavelength plate 6. The reason is that if the light beam transmitted through the quarter wavelength plate deviates from a parallel light beam, astigmatism will be created to abnormal rays. This astigmatism cannot be corrected by a method of rotating two sheets of crystal by 90° about the optical axis with respect to each other and cementing them together as is done with ordinary wavelength plates. That is, astigmatism will be created to both of normal rays and abnormal rays.

Assuming that the amount of this astigmatism is represented by a wave surface aberration W and when $(n_o-n_e)$ is the difference in refractive index between normal rays and abnormal rays and d is the thickness of the crystal and $\theta$ is the deviation from the parallel light, i.e., the angle of divergence (or convergence) of the light beam, the wave surface aberration W is represented by the following equation:

$$W=(n_o-n_e)d\theta^2/2$$

Where for example, the quarter wavelength plate is constructed of rock crystal, $(n_o-n_e)=0.01$ and the state of divergence (convergence) of the light beam is $\theta=14°$. When the wavelength used is $\lambda$, to maintain a sufficiently good imaging performance, it is preferable that the wave surface aberration W be maintained at a quarter wavelength, i.e. $\lambda/4$, or less. For that purpose, on the assumption that the wavelength $\lambda$ is e.g. 248 nm, from the above equation, d must be $$d<100\ \mu m.$$

DESCRIPTION OF THE PREFERRED EMBODIMENTS

Some embodiments of a catadioptric reduction projection optical system according to the present invention will hereinafter be described with reference to FIGS. 1 to 5. The embodiments to be described hereinafter are ones in which the present invention is applied to the optical system of an exposure apparatus for the manufacture of semiconductors in which the wavelength used is 248 nm and the reduction magnification is 1/5.

Referring to FIG. 1 which schematically shows the construction of such optical system, the reference numeral 1 designates a reticle on which a pattern for integrated circuit is formed. On an optical axis perpendicular to this reticle 1, there are disposed in succession a first lens unit G1 having negative or positive refractive power, a first plane parallel plate 2, a second plane parallel plate 3, a third plane parallel plate 4, a semi-transparent mirror 5, a quarter wavelength plate 6, a second lens unit G2 having negative refractive power, and a concave reflecting mirror 7, and in a direction in which reflected light by the concave reflecting mirror 7 is reflected by the semi-transparent surface 5a of the semi-transparent mirror 5, there are disposed in succession a third lens unit G3 having positive refractive power and a wafer 8.

FIG. 3 schematically shows the construction of another optical system according to the present invention, and again in FIG. 3, the reference numeral 1 designates a reticle on which a pattern for integrated circuit is formed. On an optical axis Ax perpendicular to this reticle 1, there are disposed in succession a first lens unit G1 having positive refractive power, an obliquely disposed plane parallel plate 2 for aberration correction, a semi-transparent mirror 5, a quarter wavelength plate 6, a second lens unit G2 having negative refractive power, and a concave reflecting mirror 7, and in a direction in which reflected light by the concave reflecting mirror 7 is reflected by the semi-transparent surface 5a of the semi-transparent mirror 5, there are disposed in succession a third lens unit G3 having positive refractive power and a wafer 8.

The obliquely disposed plane parallel plate 2 for aberration correction and the semi-transparent mirror 5 each are inclined by 45° with respect to the optical axis, and the thickness of the plane parallel plate 2 is made equal to the thickness of the semi-transparent mirror 5. Further, the azimuth of the plane parallel plate 2 is rotated by 90° from the azimuth of the semi-transparent mirror 5. Astigmatism by the semi-transparent mirror 5 is corrected well by the plane parallel plate 2.

In the constructions of FIGS. 1 and 3, the reticle 1 is illuminated by an illuminating optical system, not shown, and the light beam emerging from the reticle 1 is caused to diverge or converge by the first lens unit G1 and enter the semi-transparent mirror 5 through the plane parallel plates 2-4. The light beam transmitted through the semi-transparent surface 5a of the semi-transparent mirror 5 is caused to enter the concave reflecting mirror 7 through the quarter wavelength plate 6 and the second lens unit G2. The radius of curvature of the concave reflecting mirror 7 is about 400 mm. The light beam reflected by the concave reflecting mirror 7 passes through the second lens unit G2 and the quarter wavelength plate 6 and again travels toward the semi-transparent mirror 5 while being converged, and the light beam reflected by the semi-transparent surface 5a of the semi-transparent mirror 5 is converged on the wafer 8 by the third lens unit G3 of positive refractive power. Thereby, the reduced image of the pattern on the reticle 1 is formed on the wafer 8.

Also, it is efficient that a light beam polarized in parallelism to the plane of the drawing sheet of FIG. 1 (p-polarized light) be used as the illuminating light, but ordinary random-polarized illuminating light may also be used In any case, most of the p-polarized component in the illuminating light is transmitted through the semi-transparent surface 5a due to the polarizing characteristic of the semi-transparent mirror 5, and this transmitted light is transmitted through the quarter wavelength plate 4, whereby it becomes circularly polarized light.

This circularly polarized light beam is reflected by the concave reflecting mirror 7 and becomes circularly polarized light opposite in direction, and when the circularly polarized light beam opposite in direction is again transmitted through the quarter wavelength plate 6, the polarized state becomes linear polarization perpendicular to the plane of the drawing sheet of FIG. 1. Most of the light beam polarized in a direction perpendicular to the plane of the drawing sheet of FIG. 1 by the polarizing characteristic of the semi-transparent mirror 5 is reflected by the semi-transparent surface 5a and travels toward the wafer 8. Thereby the decrease in the light on the semi-transparent mirror 5 is prevented and the return light to the reticle 1 decreases and therefore, the effective utilization of the light beam and a decrease in flare can be achieved.

Further, by thin uniaxial crystal (e.g. rock crystal) being used as the quarter wavelength plate 6, the creation of astigmatism is prevented. Specifically, assuming that rock crystal is used, when the wavelength $\lambda$ used is 248 nm, to suppress the wave surface aberration by the quarter wavelength plate 6 to $\lambda/4$ or below, it is necessary that the thickness of the quarter wavelength plate 6 be 100 $\mu$m or less.

If the semi-transparent surface 5a of the semi-transparent mirror 5 is positively endowed with a polarizing characteristic like that of a polarizing beam splitter, reflectance and transmittance can be further improved by the combination thereof with the quarter wavelength plate 6. However, even in case of an ordinary semi-transparent mirror, the dielectric material film thereof has a strong polarizing characteristic and therefore, by the combination thereof with the quarter wavelength plate 6, reflectance and transmittance can be improved.

Specific examples of the construction of the optical system of FIG. 1 will hereinafter be described.

In order to represent the shapes of and the spacings between lenses in the following embodiments, with the reticle 1 as the first surface, the surfaces through which the light emerging from the reticle 1 passes until it arrives at the wafer 8 are successively defined as the ith surface (i=2, 3, ... ). As regards the sign of the radius of curvature $r_i$ of the ith surface, between the reticle 1 and the concave reflecting mirror 7, a case where the ith surface is convex relative to the reticle 1 is chosen to positive, and between the semi-transparent surface 5a of the semi-transparent mirror 5 and the wafer 8, a case where the ith surface is convex relative to that semi-transparent surface is chosen to positive. Also, as regards the sign of the surface spacing $d_i$ between the ith surface and the (i+1)th surface, it is chosen to negative in the area wherein the reflected light from the concave reflecting mirror 7 passes to the semi-transparent surface 5a of the semi-transparent mirror 5, and it is chosen to positive in the other areas. Also, as glass materials, $CaF_2$ represents fluorite and $SiO_2$ represents quartz glass. The refractive indices of quartz glass and fluorite for the standard wavelength used (248 nm) are as follows:

quartz glass: 1.50855
fluorite : 1.46799

FIRST EMBODIMENT

Figure 4:
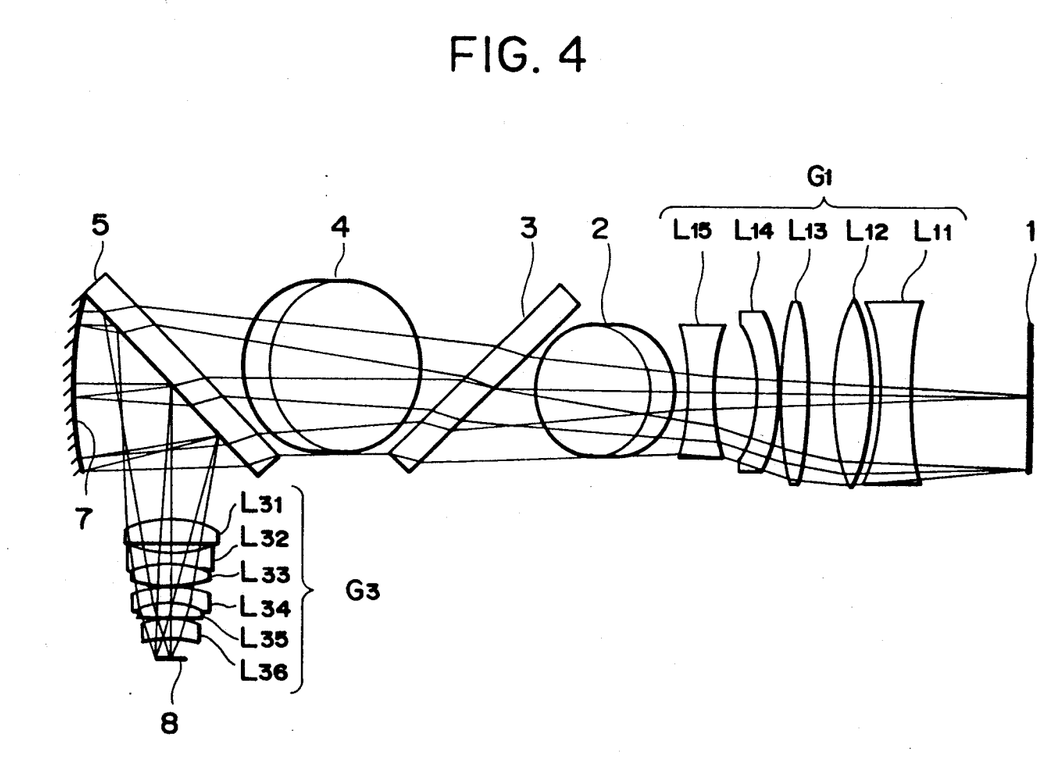
FIG. 4 shows a lens construction according to a first embodiment of the present invention.

FIG. 4 shows the lens construction of a first embodiment. As shown in FIG. 4, the first lens unit G1 comprises, in succession from the reticle 1 side, a biconcave lens $L_{11}$, a biconvex lens $L_{12}$, a biconvex lens $L_{13}$, a negative meniscus lens $L_{14}$ having its convex surface facing the reticle 1 and a biconcave lens $L_{15}$. In the present embodiment, the additional lens unit G2 is not used. Further, the third lens unit G3 comprises, in succession from the semi-transparent mirror 5 side, a positive meniscus lens $L_{31}$ having its convex surface facing the semi-transparent mirror 5 side, a biconcave lens $L_{32}$, a biconvex lens $L_{33}$, a negative meniscus lens $L_{34}$ having its convex surface facing the semi-transparent mirror 5 side, a biconvex lens $L_{35}$ and a positive meniscus lens $L_{36}$ having its convex surface facing the semi-transparent mirror 5 side. The quarter wavelength plate 6 in FIG. 1 is negligibly thin and therefore is not shown in FIG. 4.

The radius of curvature $r_i$, the surface spacing $d_i$ and glass materials in the first embodiment of FIG. 4 are shown in Table 1 below.

TABLE 1

Numerical Data of First Embodiment

| i | $r_i$ | $d_i$ | glass material |
|---|---|---|---|
| 1 | ∞ | 51.910 | |
| 2 | −223.371 | 20.000 | $CaF_2$ |
| 3 | 232.874 | 6.000 | |
| 4 | 257.055 | 32.000 | $SiO_2$ |
| 5 | −146.386 | 16.818 | |
| 6 | 376.776 | 20.000 | $SiO_2$ |
| 7 | −188.260 | 1.000 | |
| 8 | 131.915 | 16.000 | $CaF_2$ |
| 9 | 100.367 | 30.000 | |
| 10 | −122.526 | 18.000 | $SiO_2$ |
| 11 | 182.282 | 50.000 | |
| 12 | ∞ | 20.000 | $SiO_2$ |
| 13 | ∞ | 70.000 | |
| 14 | ∞ | 20.000 | $SiO_2$ |
| 15 | ∞ | 90.000 | |
| 16 | ∞ | 20.000 | $SiO_2$ |
| 17 | ∞ | 94.000 | |
| 18 | ∞ | 20.000 | $SiO_2$ |
| 19 | ∞ | 75.435 | |
| 20 | −392.660 | −75.435 | |
| 21 | ∞ | 64.691 | |
| 22 | 72.100 | 17.000 | $CaF_2$ |
| 23 | 329.873 | 9.000 | |
| 24 | −239.781 | 11.000 | $SiO_2$ |
| 25 | 91.969 | 5.300 | |
| 26 | 166.797 | 13.800 | $CaF_2$ |
| 27 | −374.866 | 0.200 | |
| 28 | 93.741 | 11.096 | $SiO_2$ |
| 29 | 40.662 | 1.000 | |
| 30 | 40.807 | 19.000 | $CaF_2$ |
| 31 | −181.965 | 1.200 | |
| 32 | 104.781 | 12.800 | $CaF_2$ |
| 33 | 148.726 | 17.381 | |

(n the embodiment of FIG. 4, the reduction magnification is 1/5, the numerical aperture is 0.4 and the diameter d of the effective exposure area (image circle) on the wafer 8 is 20 mm. Also, the radius of curvature r of the concave reflecting mirror 7 is 392.66 mm, and the radius of curvature r is about 19.6 times the diameter d.

Further, the maximum value of the inclination of the marginal ray (Rand ray) from the on-axis object point incident on the concave reflecting mirror 7 with respect to the optical axis is 6.18°, and the maximum value of the inclination of the off-axis principal ray incident on the concave reflecting mirror 7 with respect to the optical axis is 3.44°. Incidentally, the maximum value of the inclination of the Rand ray emerging from the concave reflecting mirror 7 with respect to the optical axis is 10.70°.

In the first embodiment of FIG. 4, the numerical aperture is 0.40 and various aberrations are corrected well in the wide area of the image circle. Chromatic aberration is also corrected well for the wavelength λ of 248 nm−249 nm.

SECOND EMBODIMENT

Figure 5:
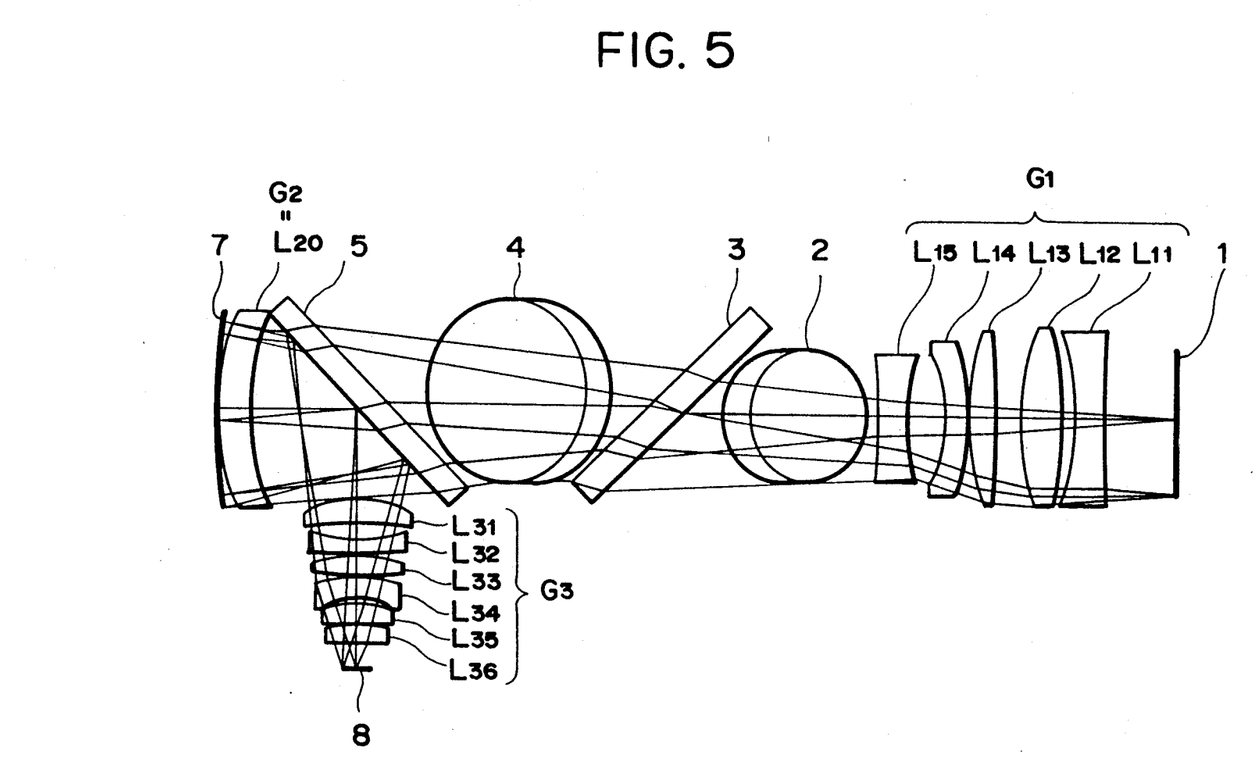
FIG. 5 shows a lens construction according to a second embodiment of the present invention.

FIG. 5 shows the lens construction of a second embodiment. As shown in FIG. 5, the first lens unit G1 comprises, in succession from the reticle 1 side, a biconcave lens $L_{11}$, a biconvex lens $L_{12}$, a biconvex lens $L_{13}$, a negative meniscus lens $L_{14}$ having its convex surface facing the reticle 1, and a biconcave lens $L_{15}$. Also, in the present embodiment, the second lens unit G2 is comprised of only a negative meniscus lens $L_{20}$ having its concave surface facing the reticle 1 side. Further, the third lens unit G3 comprises, in succession from the semi-transparent mirror 5 side, a positive meniscus lens $L_{31}$ having its convex surface facing the semi-transparent mirror 5 side, a biconcave lens $L_{32}$, a biconvex lens $L_{33}$, a negative meniscus lens $L_{34}$ having its convex surface facing the semi-transparent mirror 5 side, a positive meniscus lens $L_{35}$ having its convex surface facing the semi-transparent mirror 5 side, and a positive meniscus lens $L_{36}$ having its convex surface facing the semi-transparent mirror 5 side. The quarter wavelength plate 6 in FIG. 1 is negligibly thin and therefore is not shown in FIG. 5.

The radius of curvature $r_i$, the surface spacing $d_i$ and glass materials in the second embodiment of FIG. 5 are shown in Table 2 below.

TABLE 2

Numerical Data of Second Embodiment

| i | $r_i$ | $d_i$ | glass material |
|---|---|---|---|
| 1 | ∞ | 71.910 | |
| 2 | −331.269 | 20.000 | $CaF_2$ |
| 3 | 247.759 | 4.000 | |
| 4 | 242.788 | 32.000 | $SiO_2$ |
| 5 | −149.834 | 16.818 | |
| 6 | 381.244 | 20.000 | $SiO_2$ |
| 7 | −251.080 | 1.000 | |
| 8 | 181.255 | 16.000 | $CaF_2$ |
| 9 | 111.725 | 30.000 | |
| 10 | −116.618 | 18.000 | $SiO_2$ |
| 11 | 374.749 | 50.000 | |
| 12 | ∞ | 20.000 | $SiO_2$ |
| 13 | ∞ | 70.000 | |
| 14 | ∞ | 20.000 | $SiO_2$ |
| 15 | ∞ | 90.000 | |
| 16 | ∞ | 20.000 | $SiO_2$ |
| 17 | ∞ | 94.000 | |
| 18 | ∞ | 20.000 | $SiO_2$ |
| 19 | ∞ | 75.435 | |
| 20 | −161.300 | 22.000 | $SiO_2$ |
| 21 | −184.047 | 2.000 | |
| 22 | −414.280 | −2.000 | |
| 23 | −184.047 | −22.000 | $SiO_2$ |
| 24 | −161.300 | −75.435 | |
| 25 | ∞ | 64.691 | |
| 26 | 72.301 | 17.000 | $CaF_2$ |
| 27 | 150.614 | 11.000 | |
| 28 | −159.386 | 11.000 | $SiO_2$ |
| 29 | 7177.924 | 3.300 | |
| 30 | 161.829 | 13.800 | $CaF_2$ |
| 31 | −197.510 | 0.200 | |
| 32 | 124.113 | 11.096 | $SiO_2$ |
| 33 | 33.879 | 1.000 | |
| 34 | 34.202 | 19.000 | $CaF_2$ |
| 35 | 196.355 | 1.200 | |
| 36 | 92.275 | 12.800 | $CaF_2$ |
| 37 | 310.070 | 17.381 | |

In the embodiment of FIG. 5, the reduction magnification is 115, the numerical aperture is 0.4, and the diameter d of the effective exposure area (image circle)

on the wafer 8 is 20 mm. The radius of curvature r of the concave reflecting mirror 7 is 414.28 mm, and the radius of curvature r is about 20.7 times the diameter d.

Further, the maximum value of the inclination of the marginal ray (Rand ray) from the one-axis object point incident on the concave reflecting mirror 7 with respect to the optical axis is 6.08°, and the maximum value of the inclination of the off-axis principal ray incident on the concave reflecting mirror 7 with respect to the optical axis is 3.34°. Incidentally, the maximum value of the inclination of the Rand ray emerging from the concave reflecting mirror 7 with respect to the optical axis is 10.47°.

In the second embodiment of FIG. 5, the numerical aperture is 0.40 and various aberrations are corrected well in the wide area of the image circle. Also, chromatic aberration is corrected well for the wavelength $\lambda$ of 248 nm–249 nm.

Figure 6:
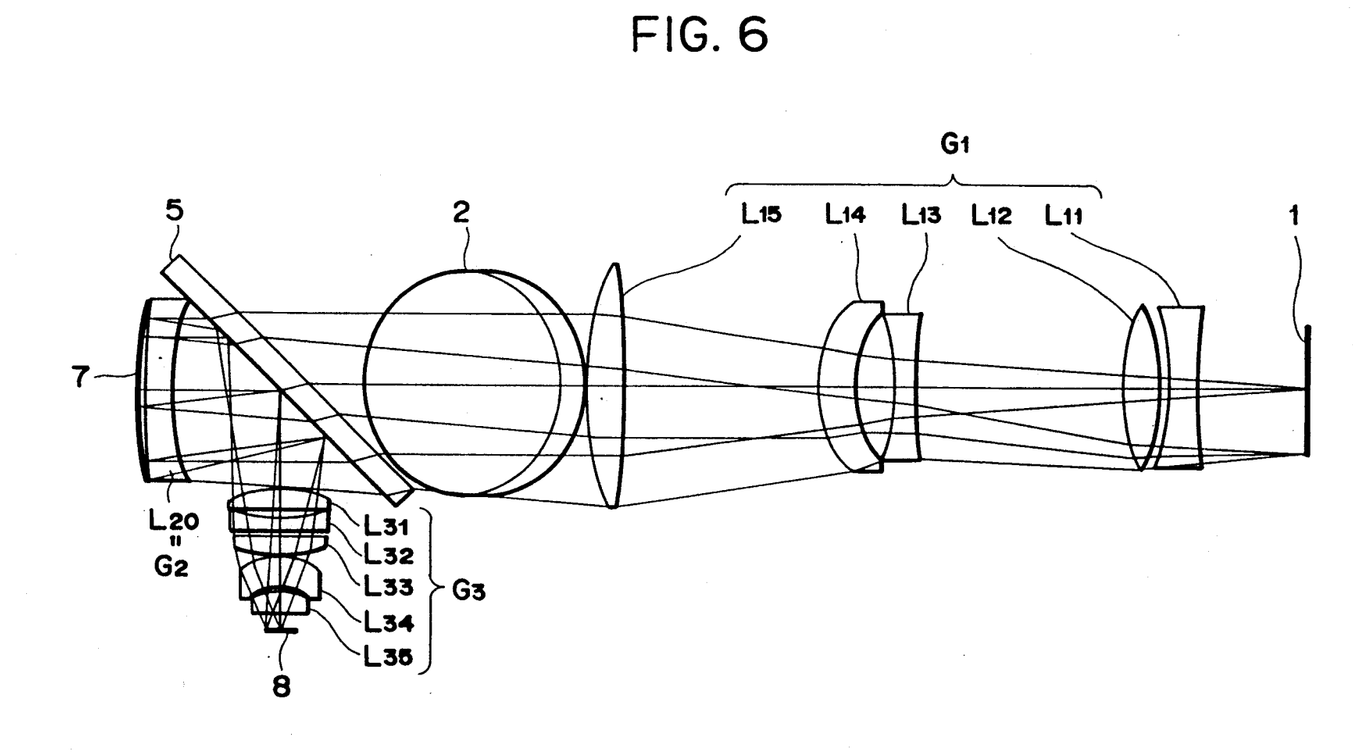
FIG. 6 shows a lens construction according to a third embodiment of the present invention.

FIG. 6 shows the lens construction of a third embodiment. As shown in FIG. 6, the first lens unit G1 comprises, in succession form the reticle 1 side, a biconcave lens $L_{11}$, a biconvex lens $L_{12}$, a biconcave lens $L_{13}$, a negative meniscus lens $L_{14}$ having its concave surface facing the reticle 1, and a biconvex lens $L_{15}$. The second lens unit G2 is comprised of only a negative meniscus lens $L_{20}$ having its concave surface facing the reticle 1 side. Further, the third lens unit G3 comprises, in succession from the semi-transparent mirror 5 side, a biconvex lens $L_{31}$, a biconcave lens $L_{32}$, a positive meniscus lens $L_{33}$ having its concave surface facing the semi-transparent mirror 5 side, a negative meniscus lens $L_{34}$ having its convex surface facing the semi-transparent mirror 5 side, and a positive meniscus lens $L_{35}$ having its convex surface facing the semi-transparent mirror 5 side. The quarter wavelength plate 4 in FIG. 4 is negligibly thin and therefore is not shown in FIG. 6.

The radius of curvature $r_i$, the surface spacing $d_i$ and glass materials in the third embodiment of FIG. 6 are shown in Table 3 below.

TABLE 3

| i | $r_i$ | $d_i$ | glass material |
|---|---|---|---|
| 1 | ∞ | 85.910 | |
| 2 | −694.027 | 23.000 | $SiO_2$ |
| 3 | 184.154 | 7.000 | |
| 4 | 200.697 | 29.000 | $CaF_2$ |
| 5 | −164.649 | 170.247 | |
| 6 | −613.671 | 16.000 | $CaF_2$ |
| 7 | 177.239 | 33.000 | |
| 8 | −91.491 | 28.000 | $CaF_2$ |
| 9 | −104.633 | 154.707 | |
| 10 | 852.687 | 30.000 | $SiO_2$ |
| 11 | −282.186 | 80.000 | |
| 12 | ∞ | 20.000 | $SiO_2$ |
| 13 | ∞ | 125.000 | |
| 14 | ∞ | 20.000 | $SiO_2$ |
| 15 | ∞ | 86.000 | |
| 16 | −219.923 | 20.000 | $SiO_2$ |
| 17 | −706.690 | 5.000 | |
| 18 | −377.539 | −5.000 | |
| 19 | −706.690 | −20.000 | $SiO_2$ |
| 20 | −219.923 | −86.000 | |
| 21 | ∞ | 80.126 | |
| 22 | 81.237 | 17.000 | $CaF_2$ |
| 23 | −4495.256 | 4.000 | |
| 24 | −168.107 | 12.000 | $SiO_2$ |
| 25 | 511.018 | 5.000 | |
| 26 | −2867.360 | 14.000 | $CaF_2$ |
| 27 | −147.910 | 1.300 | |
| 28 | 45.917 | 24.096 | $SiO_2$ |
| 29 | 30.175 | 3.000 | |
| 30 | 36.392 | 18.000 | $CaF_2$ |

TABLE 3-continued

| i | $r_i$ | $d_i$ | glass material |
|---|---|---|---|
| 31 | 369.346 | 14.381 | |

In the third embodiment of FIG. 6, the reduction magnification is 1/5, the numerical aperture is 0.45 and the diameter d of the effective exposure area (image circle) on the wafer 8 is 20 mm. The radius of curvature r of the concave reflecting mirror 7 is 377.539 mm, and the radius of curvature r is about 18.9 times the diameter d.

Further, the maximum value of the inclination of the marginal ray (Rand ray) from the on-axis object point incident on the concave reflecting mirror 7 with respect to the optical axis is 0.004°, and the maximum value of the inclination of the off-axis principal ray incident on the concave reflecting mirror 7 with respect to the optical axis is 4.76°. Incidentally, the maximum value of the inclination of the Rand ray emerging from the concave reflecting mirror 7 with respect to the optical axis is 7.97°. Further, the inclination of the Rand ray transmitted through the semi-transparent mirror, 5 with respect to the optical axis is 0.001° or less, and coma and astigmatism are corrected substantially completely.

In the third embodiment of FIG. 6, in spite of the numerical aperture being as great as 0.45, various aberrations are corrected well in the wide area of the image circle. Also, chromatic aberration is corrected well for the wavelength $\lambda$ of 248 nm−249 nm.

The present invention is not restricted to the above-described embodiments, but of course can assume various constructions without departing from the gist of the invention.

What is claimed is:

1. A catadioptric reduction projection optical system for reduction-projecting the pattern of a first surface onto a second surface, including:

a first lens unit G1 for causing a light beam from said first surface to diverge or converge;

a semi-transparent mirror having a plane parallel plate for transmitting therethrough the light beam from said first lens unit G1;

a concave reflecting mirror for returning the light beam emerging from said semi-transparent mirror to said semi-transparent mirror while condensing said light beam;

a second lens unit G2 of negative refractive power disposed between said semi-transparent mirror and said concave reflecting mirror;

a third lens unit G3 of positive refractive power for converging the light beam returned to said semi-transparent mirror by the reflection on said concave reflecting mirror and reflected by said semi-transparent mirror and forming a reduced image of the pattern of said first surface on said second surface; and aberration correcting means disposed between said first lens unit G1 and said semi-transparent mirror to correct aberrations created by said semi-transparent mirror, said aberration correcting means having at least one correcting plane parallel plate disposed obliquely with respect to the optical axis of said first lens unit G1, said correcting plane parallel plate and the plane parallel plate of said semi-transparent mirror being disposed at locations whereat azimuth angles defined as the directions of normals to said plane parallel plates have been rotated by a multiple of 90° about the optical axis of said first lens unit G1.

2. A catadioptric reduction projection optical system according to claim 1, wherein said first lens unit G1 has negative refractive power, said aberration correcting means has three correcting plane parallel plates disposed obliquely with respect to the optical axis of said first lens unit G1, and said three correcting plane parallel plates and the plane parallel plate of said semi-transparent mirror are disposed at locations whereat azimuth angles defined as the directions of normals to said plane parallel plates have been rotated by an angle of 90° each about the optical axis of said first lens unit G1.

3. A catadioptric reduction projection optical system according to claim 1, wherein the radius of curvature of said concave reflecting mirror is 17 times to 25 times the diameter of an exposure area on said second surface.

4. A catadioptric reduction projection optical system according to claim 1, wherein the inclination of an off-axis principal ray incident on said concave reflecting mirror with respect to the optical axis is 6° or less.

5. A catadioptric reduction projection optical system according to claim 1, further including a quarter wavelength plate disposed between said semi-transparent mirror and said concave reflecting mirror and wherein said semi-transparent mirror has a polarization separating surface for selecting reflection and transmission in conformity with the polarized state of the light from said first surface.

6. A catadioptric reduction projection optical system according to claim 5, wherein the thickness of said quarter wavelength plate is 100 mµ or less.

7. A catadioptric reduction projection optical system for reduction-projecting the pattern of a first surface onto a second surface, including:
an anterior lens unit for causing a light beam from said first surface to diverge or converge;
a semi-transparent mirror having a plane parallel plate for transmitting therethrough the light beam from said anterior lens unit;
a concave reflecting mirror for returning the light beam emerging from said semi-transparent mirror to said semi-transparent mirror while condensing said light beam;
a posterior lens unit of positive refractive power for converging the light beam returned to said semi-transparent mirror and reflected by said semi-transparent mirror and forming a reduced image of the pattern of said first surface on said second surface; and
aberration correcting means disposed between said anterior lens unit and said semi-transparent mirror to correct aberrations created by said semi-transparent mirror, said aberration correcting means having at least one correcting plane parallel plate disposed obliquely with respect to the optical axis of said anterior lens unit, said correcting plane parallel plate and the plane parallel plate of said semi-transparent mirror being disposed at locations whereat azimuth angles defined as the directions of normals to said plane parallel plates have been rotated by a multiple of 90° about the optical axis of said anterior lens unit.

8. A catadioptric reduction projection optical system according to claim 7, wherein said anterior lens unit has negative refractive power, said aberration correcting means has three correcting plane parallel plates disposed obliquely with respect to the optical axis of said anterior lens unit, and said three correcting plane parallel plates and the plane parallel plate of said semi-transparent mirror are disposed at locations whereat azimuth angles defined as the directions of normals to said plane parallel plates have been rotated by an angle of 90° each about the optical axis of said anterior lens unit.

9. A catadioptric reduction projection optical system according to claim 7, further including a lens unit of negative refractive power disposed between said semi-transparent mirror and said concave reflecting mirror.

10. A catadioptric reduction projection optical system according to claim 7, wherein the radius of curvature of said concave reflecting mirror is 17 times to 25 times the diameter of an exposure area on said second surface.

11. A catadioptric reduction projection optical system according to claim 7, wherein said anterior lens unit is a positive lens unit for converting the light beam from said first surface into a substantially parallel light beam, said aberration correcting means has a correcting plane parallel plate disposed obliquely with respect to the optical axis of said anterior lens unit, and said correcting plane parallel plate and the plane parallel plate of said semi-transparent mirror are disposed at locations whereat azimuth angles defined as the directions of normals to said plane parallel plates have been rotated by an angle of 90° about the optical axis of said anterior lens unit.

12. A catadioptric reduction projection optical system for reduction-projecting the pattern of a first surface onto a second surface, including:
a semi-transparent mirror having a plane parallel plate for dividing the optical path of a light beam from said first surface into a reflecting optical path and a transmitting optical path;
a concave reflecting mirror disposed on one of the transmitting optical path and the reflecting optical path of a light beam emerging from said semi-transparent mirror for returning said emerging light beam to said semi-transparent mirror;
an anterior lens unit disposed between said semi-transparent mirror and said first surface;
a posterior lens unit of positive refractive power for converging the light beam returned to said semi-transparent mirror by said concave reflecting mirror and emerging from said semi-transparent mirror and forming a reduced image of the pattern of said first surface on said second surface; and
aberration correcting means disposed between said anterior lens unit and said semi-transparent mirror to correct aberrations created by said semi-transparent mirror, said aberration correcting means having at least one correcting plane parallel plate disposed obliquely with respect to the optical axis of said anterior lens unit, said correcting plane parallel plate and the plane parallel plate of said semi-transparent mirror being disposed at locations whereat azimuth angles defined as the directions of normals to said plane parallel plates have been rotated by a multiple of 90° about the optical axis of said anterior lens unit.

* * * * *